United States Patent
Park et al.

(10) Patent No.: US 10,152,282 B2
(45) Date of Patent: Dec. 11, 2018

(54) CALIBRATION MEMORY CONTROL METHOD AND APPARATUS OF ELECTRONIC CONTROL UNIT

(71) Applicant: HYUNDAI MOTOR COMPANY, Seoul (KR)

(72) Inventors: Yong Seok Park, Seoul (KR); Chang Yu Kim, Bucheon-si (KR)

(73) Assignee: HYUNDAI MOTOR COMPANY, Seoul (KR)

( * ) Notice: Subject to any disclaimer, the term of this patent is extended or adjusted under 35 U.S.C. 154(b) by 442 days.

(21) Appl. No.: 14/639,095

(22) Filed: Mar. 4, 2015

(65) Prior Publication Data
US 2016/0133304 A1  May 12, 2016

(30) Foreign Application Priority Data

Nov. 6, 2014  (KR) .................. 10-2014-0153652

(51) Int. Cl.
  *G06F 12/02*  (2006.01)
  *G06F 3/06*  (2006.01)
  (Continued)

(52) U.S. Cl.
  CPC ............ *G06F 3/0673* (2013.01); *G06F 3/065* (2013.01); *G06F 3/0619* (2013.01);
  (Continued)

(58) Field of Classification Search
  None
  See application file for complete search history.

(56) References Cited

U.S. PATENT DOCUMENTS

| 2002/0091462 A1* | 7/2002 | Allen ................. G05B 19/0426 700/176 |
| 2003/0078701 A1 | 4/2003 | Sunami et al. |

(Continued)

FOREIGN PATENT DOCUMENTS

| JP | 2004-005296 A | 1/2004 |
| JP | 2004005296 A | 1/2004 |

(Continued)

OTHER PUBLICATIONS

Office Action issued in corresponding Korean Application No. 10-2014-0153652, dated Jul. 30, 2015.

*Primary Examiner* — Charles Rones
*Assistant Examiner* — Ryan Dare
(74) *Attorney, Agent, or Firm* — McDermott Will & Emery LLP (57) ABSTRACT

A calibration memory control method of an ECU connected to an external calibration device may include receiving a download command from the external calibration device, checking a sub reference page corresponding to the download command, determining whether a sub working page corresponding to the checked sub reference page is allocated, allocating the sub working page corresponding to the checked sub reference page to a RAM region upon determining that the sub working page is not allocated, and copying data stored in the checked sub reference page to the allocated sub working page. As such, according to the present invention, restrictive memory resources may be efficiently used for calibration.

24 Claims, 5 Drawing Sheets

(51) Int. Cl.
*G11C 29/02* (2006.01)
*G11C 29/56* (2006.01)

(52) U.S. Cl.
CPC .......... *G06F 3/0659* (2013.01); *G11C 29/028* (2013.01); *G11C 29/56* (2013.01)

(56) References Cited

U.S. PATENT DOCUMENTS

| | | | |
|---|---|---|---|
| 2007/0213895 A1* | 9/2007 | Nakayama | G07C 5/0808 701/31.4 |
| 2008/0010563 A1* | 1/2008 | Nishimura | G06F 9/4812 714/55 |
| 2008/0195356 A1* | 8/2008 | Wenzel | G06F 11/263 702/189 |
| 2013/0073116 A1* | 3/2013 | Abe | G06F 8/60 701/1 |
| 2015/0186548 A1* | 7/2015 | Chun | G07C 5/008 707/769 |

FOREIGN PATENT DOCUMENTS

| | | |
|---|---|---|
| JP | 2004348441 A | 12/2004 |
| JP | 2009053918 A | 3/2009 |
| JP | 2011100416 A | 5/2011 |
| JP | 2013024117 A | 2/2013 |
| KR | 10-2011-0018605 A | 2/2011 |
| KR | 10-2012-0058878 A | 6/2012 |
| KR | 10-2012-0069470 A | 6/2012 |
| KR | 10-2013-0117077 A | 10/2013 |

* cited by examiner

FIG. 1

Table. 1 Program and RAM Sizes per ECU

| ECU | Program Size | RAM Size |
|---|---|---|
| ECU 1 | 1119 KB | 64 KB |
| ECU 2 | 942 KB | 192 KB |
| ECU 3 | 1024 KB | 256 KB |

Table. 2 Number of TLB Entries per Microprocessor

| Micro Processor | Number of TLB Entries |
|---|---|
| MPC 5553 | 32 |
| MPC 5644A | 24 |
| MPC 5674F | 64 |

FIG. 8

Table. 3 Data Copy Method Comparison Table

|  | Conventional | Multi Page |
|---|---|---|
| Reference→Working Data Copy Timing | ECU Initialization Stage | After Subpage Allocation Request |
| Data Copy Region | Total Reference Page | Subpage |
| Data Copy Unit | Total Reference Page | Subpage or Smaller Size |

FIG. 9

CALIBRATION MEMORY CONTROL METHOD AND APPARATUS OF ELECTRONIC CONTROL UNIT

CLAIM OF PRIORITY

This application claims the benefit of Korean Patent Application No. 10-2014-0153652, filed on Nov. 6, 2014, which is hereby incorporated by reference as if fully set forth herein.

BACKGROUND OF THE INVENTION

Field of the Invention

The present invention relates to a calibration memory control method and apparatus of an electronic control unit (ECU) and, more particularly, to a calibration memory control method and apparatus of an ECU capable of expanding calibration memory space using a multipage calibration algorithm in data calibration through a vehicle CAN (controller area network) calibration protocol (CCP).

Discussion of the Related Art

Specifications of mass-produced vehicles even in the same model may differ depending on options and regions, and electronic control units (ECUs) are developed in parallel with the development of actual vehicles. Accordingly, a control program of a vehicle has variables for a large number of control factors to calibrate the difference between an actual vehicle and a simulation. Here, the control factors which are changeable on the control program of the vehicle are called calibration variables.

A vehicle developer performs calibration in developing and testing processes to determine optimized control factors corresponding to various specifications.

Accordingly, the vehicle developer can develop a vehicle having target performance by ultimately determining control factors according to a vehicle model not at an initial stage of development but at a time when the vehicle is actually prepared.

These variables include not only some factors, values of which are definitely determined according to the vehicle model, but also other factors, values of which need to be adjusted and changed during actual operation of the vehicle for optimal values.

An ECU and an external calibration tool use a standard calibration protocol for data which should be calibrated in real time during operation of the vehicle. Representative examples of the calibration protocol include a CAN (controller area network) calibration protocol (CCP) and an extended calibration protocol (XCP).

Numerous control factors or maps are present in an ECU to achieve a variety of target performances during development of the ECU. A communication protocol called CCP is used to find an optimized vehicle performance by changing these data while the vehicle is being driven.

However, if the number of control factors or maps in the ECU is increased, a required memory size is also increased. In many cases, a memory size actually required in a development process is greater than an available memory size and thus calibration cannot be performed.

Figure 1:
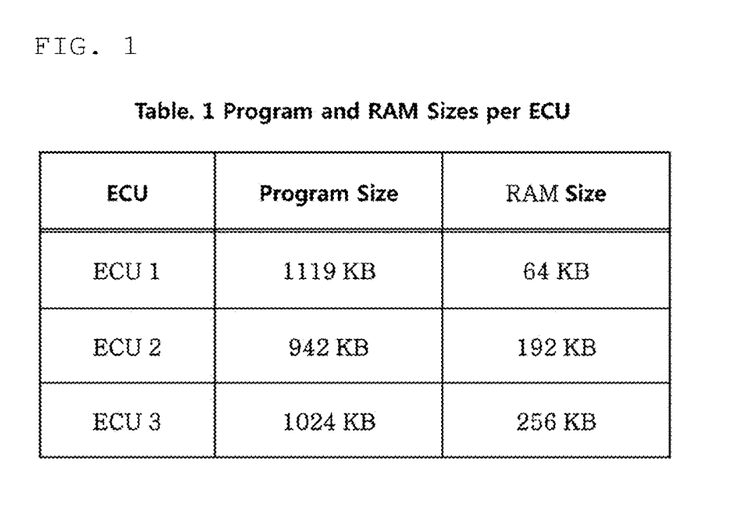
FIG. 1 is a table showing exemplary sizes of program and RAM per electronic control unit (ECU)

On the other hand, control program data of a vehicle should be retained even when power is not supplied to the ECU and thus is stored in non-volatile memory, e.g., flash memory. As shown in Table. 1 (Program and RAM Sizes per ECU) of FIG. 1, the ECU has a smaller size of RAM compared to the size of a control program and thus drives the control program of the vehicle from flash memory without loading the same in RAM.

However, the flash memory cannot instantly change a currently stored value, should store a new value after erasing the existing value, and thus is not appropriate to calibrate data in real time.

Figure 2:
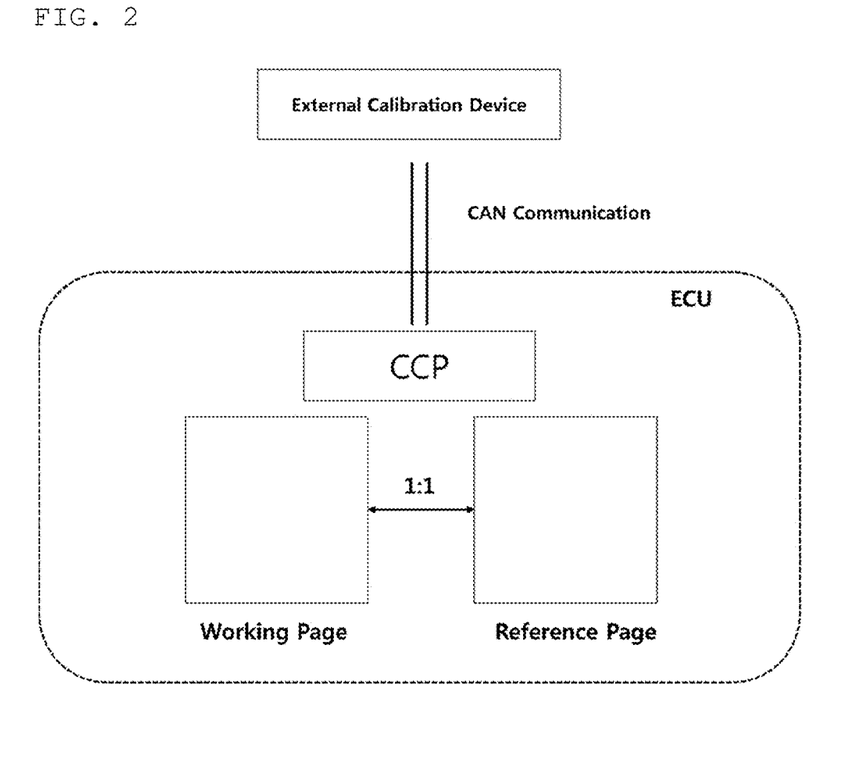
FIG. 2 is a diagram for describing a calibration memory allocation method of an ECU according to the related art.

Accordingly, to freely change the values of control factors, a conventional ECU is designed to copy data of flash memory (a reference page) to a same-sized RAM space (a working page), and to refer to an appropriate page using an address translation function of a microprocessor, as illustrated in FIG. 2.

However, in most cases, an available space of internal RAM of a microprocessor is insufficient to allocate a space corresponding to the size of calibration data to the RAM for a working page. As such, large-capacity external memory for proper calibration is additionally installed for mass-produced ECUs.

In this case, the cost of the ECU is increased. Furthermore, if the size of calibration data is increased during development of the ECU and thus available memory is insufficient, inconvenience of adjusting calibration variables may be caused.

Specifically, if a processor having no external bus is unavoidably used when a microprocessor is selected, the external memory for calibration may not be used.

SUMMARY OF THE INVENTION

Accordingly, the present invention is directed to a calibration memory control method and apparatus of an electronic control unit (ECU) that substantially obviate one or more problems due to limitations and disadvantages of the related art.

An object of the present invention is to provide a memory control method and apparatus of an ECU capable of expanding calibration memory.

Another object of the present invention is to provide a calibration memory control method of an ECU capable of expanding available calibration memory by dynamically allocating a working page based on an external calibration request.

Another object of the present invention is to provide a calibration memory control method of an ECU capable of performing calibration even when an available RAM capacity is less than a total size of calibration data, by mapping in M:M correspondence between a reference page and a working page and actually allocating only N working page regions (N<M) to memory (e.g., RAM).

A further object of the present invention is to provide a calibration memory control method of an ECU not requiring external memory for calibration.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a calibration memory control method of an electronic control unit (ECU) connected to an external calibration device includes receiving a download command from the external calibration device, checking a sub reference page corresponding to the download command, determining whether a sub working page corresponding to the checked sub reference page is allocated, allocating the sub working page corresponding to the checked sub reference page to a RAM region upon determining that the sub working page is not allocated, and copying data stored in the checked sub reference page to the allocated sub working page.

The calibration memory control method may further include storing a data block included in the download command in a part of the allocated sub working page if the data is completely copied.

The data may be copied during an idle task of a scheduler mounted on the ECU.

The data may be copied during the idle task in units of a size equal to or less than a size of the sub working page.

When the ECU is initialized, a reference page may be divided into M sub reference pages each configured to have 1:1 correspondence to a virtual sub working page.

Sub working pages not allocated to the RAM region may refer to sub reference pages configured to have 1:1 correspondence to the sub working pages.

The RAM region may have a size less than a total size of a reference page.

The calibration memory control method may further include immediately executing a command other than the download command if the command is received from the external calibration device.

The calibration memory control method may further include transmitting a parameter out of range response message to the external calibration device if a data block included in the download command exceeds a reference size.

The calibration memory control method may further include storing a data block included in the download command in the sub working page upon determining that the sub working page corresponding to the checked sub reference page is already allocated.

The calibration memory control method may further include determining whether another download command is currently being processed, and transmitting a command processor busy response message to the external calibration device upon determining that the other download command is currently being processed.

The calibration memory control method may further include storing a data block included in the download command in pre-designated buffer memory until the data is completely copied.

The download command may be received through controller area network (CAN) communication.

In another aspect of the present invention, a computer readable medium has recorded thereon a computer program for executing the above method.

In another aspect of the present invention, an electronic control unit (ECU) connected to an external calibration device includes means for receiving a download command from the external calibration device, means for checking a sub reference page corresponding to the download command, means for determining whether a sub working page corresponding to the checked sub reference page is allocated, means for allocating the sub working page corresponding to the checked sub reference page to a RAM region upon determining that the sub working page is not allocated, and means for copying data stored in the checked sub reference page to the allocated sub working page.

The ECU may further include means for storing a data block included in the download command in a part of the allocated sub working page if the data is completely copied.

The data may be copied during an idle task of a scheduler mounted on the ECU.

The data may be copied during the idle task in units of a size equal to or less than a size of the sub working page.

When the ECU is initialized, a reference page may be divided into M sub reference pages each configured to have 1:1 correspondence to a virtual sub working page.

Sub working pages not allocated to the RAM region may refer to sub reference pages configured to have 1:1 correspondence to the sub working pages.

The sub working page allocated to the RAM region may be changeable by the download command.

The RAM region may have a size less than a total size of a reference page.

A command other than the download command may be immediately executed if the command is received from the external calibration device.

A parameter out of range response message may be transmitted to the external calibration device if a data block included in the download command exceeds a reference size.

A data block included in the download command may be stored in the sub working page upon determining that the sub working page corresponding to the checked sub reference page is already allocated.

The ECU may further include means for determining whether another download command is currently being processed, and may transmit a command processor busy response message to the external calibration device upon determining that the other download command is currently being processed.

A data block included in the download command may be stored in pre-designated buffer memory until the data is completely copied.

The download command may be received through controller area network (CAN) communication.

In another aspect of the present invention, an electronic control unit (ECU) connected to an external calibration device may include a controller area network (CAN) calibration protocol (CCP) module transmitting and receiving a CCP message to and from the external calibration device, and a calibration memory management module dynamically allocating memory to be used for calibration in response to the received CCP message. The calibration memory management module divides a reference page and a working page into M sub reference pages and M sub working pages, respectively, and divides a RAM region for calibration data into N subpages, in which N is less than M. The calibration memory management module manages sub working pages of the working page not to be allocated to a RAM region among the sub working pages corresponding to sub reference pages of the reference page.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. The suffixes "module" and "unit" of elements herein are used for convenience of description and thus can be used interchangeably and do not have any distinguishable meanings or functions.

Although all elements constituting the embodiments of the present invention are described as being integrated into a single one or as being operated as a single one, the present invention is not necessarily limited to such embodiments. According to embodiments, all of the elements may be selectively integrated into one or more and be operated as one or more within the object and scope of the present invention. Each of the elements may be implemented as independent hardware. Alternatively, some or all of the elements may be selectively combined into a computer program having a program module performing some or all functions combined in one or more pieces of hardware. Code and code segments constituting the computer program may be easily reasoned by those skilled in the art to which the present invention pertains. The computer program may be stored in computer readable media such that the computer program is read and executed by a computer to implement embodiments of the present invention. Computer program storage media may include magnetic recording media, optical recording media, and carrier wave media.

The terms "comprises", "includes", or "has" described herein should be interpreted not to exclude other elements but to further include such other elements since the corresponding elements may be inherent unless mentioned otherwise. All terms including technical or scientific terms have the same meanings as generally understood by a person having ordinary skill in the art to which the present invention pertains unless mentioned otherwise. Generally used terms, such as terms defined in a dictionary, should be interpreted to coincide with meanings of the related art from the context. Unless obviously defined in the present invention, such terms are not to be interpreted as having ideal or excessively formal meanings.

It will be understood that, although the terms first, second, A, B, (a), (b), etc. may be used herein to describe various elements of the present invention, these terms are only used to distinguish one element from another element and essential, order, or sequence of corresponding elements are not limited by these terms. It will be understood that when one element is referred to as being "connected to", "combined with", or "coupled to" another element, one element may be "connected to", "combined with", or "coupled to" another element via a further element although one element may be directly connected or coupled to another element.

Figure 3:
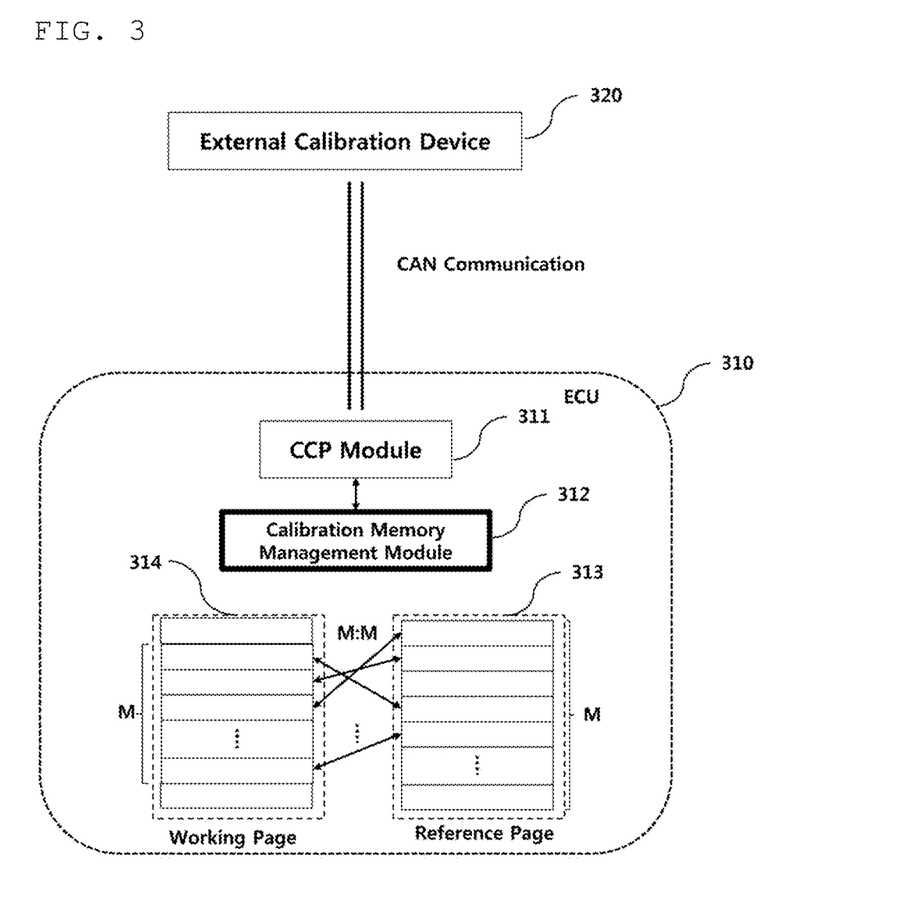
FIG. 3 is a diagram showing the structure of an ECU having a multipage calibration algorithm according to an embodiment of the present invention.

FIG. 3 is a diagram showing the structure of an electronic control unit (ECU) 310 having a multipage calibration algorithm according to an embodiment of the present invention.

Referring to FIG. 3, the ECU 310 may be connected to an external calibration device 320 through a controller area network (CAN).

The ECU 310 may be configured to include a CAN calibration protocol (CCP) module 311 and a calibration memory management module 312.

The CCP module 311 may transmit and receive a CCP message to and from the external calibration device 320 through CAN communication. The CCP message received by the CCP module 311 is transmitted to the calibration memory management module 312, and the calibration memory management module 312 dynamically allocates memory to be used for calibration according to the CCP message.

Specifically, the calibration memory management module 312 arbitrarily divides a reference page 313 and a working page 314 into M sub reference pages and M sub working pages, respectively, and dynamically allocates the working page 314 for the reference page 313 upon a request of the external calibration device 320.

In this case, data required for current calibration is selected among data recorded on the reference page 313 and the selected data is copied to the working page 314. Here, the calibration memory management module 312 may include relationship information about which sub reference page of the reference page 313 corresponds to which sub working page of the working page 314 (i.e., address mapping information).

The calibration memory management module 312 is maintained in a busy state while the above working page allocation process is being performed, and processes the CCP message received from the external calibration device 320 after the working page allocation process is completed.

Accordingly, in a calibration memory allocation method according to the present invention, although reference page regions and working page regions are mapped in M:M correspondence, only N working page regions (N<M) are actually allocated to memory (e.g., RAM) and thus a necessary memory size may be less than the reference page size.

Figure 4:
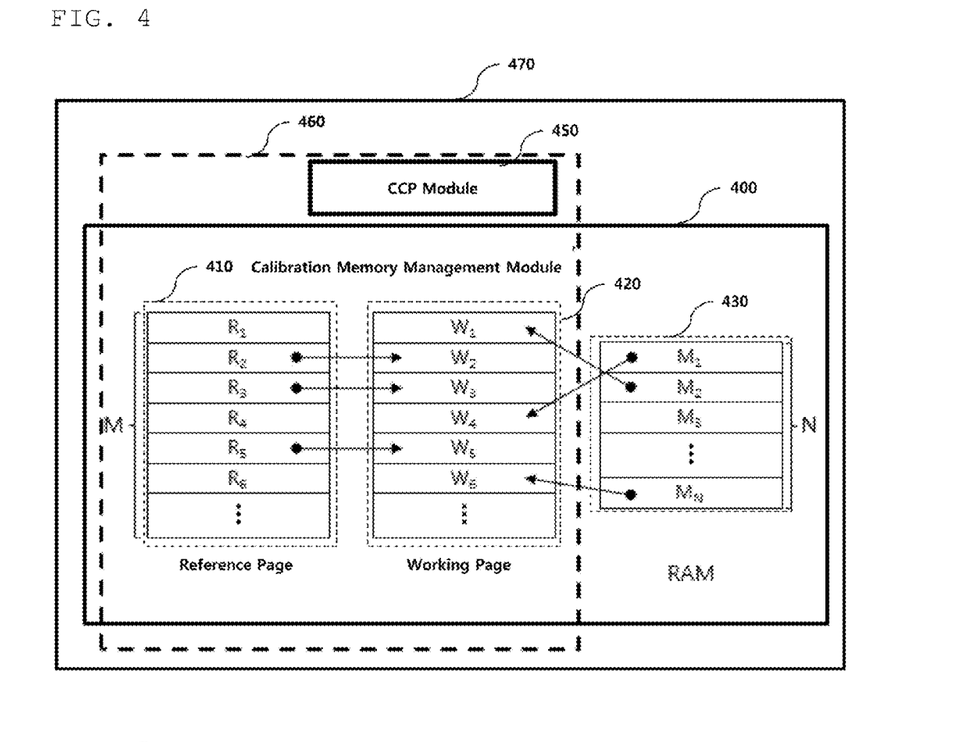
FIG. 4 is a diagram for describing the relationship between a working page and a reference page based on the multipage calibration algorithm according to an embodiment of the present invention.

FIG. 4 is a diagram for describing the relationship between a working page 420 and a reference page 410 based on the multipage calibration algorithm according to an embodiment of the present invention.

To use calibration data larger than an available RAM size of an ECU, an algorithm for dynamically allocating only calibration data currently used by a user to RAM is necessary.

As illustrated in FIG. 4, the multipage calibration algorithm according to an embodiment of the present invention adds the calibration memory management module 400 into an ECU 470 to change the correspondence between the reference page 410 and the working page 420 into M:M subpages and to divide a RAM region 430 for calibration data into N spaces for subpages.

In this case, since an available size of the RAM 430 is less than the size of the reference page 410, the number N of subpages of the RAM region 430 is less than M. To make the size of the working page 420 recognized by a CCP module 450 equal to the size of the reference page 410, the calibration memory management module 400 configures the total working page 420 in such a manner that sub working pages not allocated to the RAM region 430 among the sub working pages included in the working page 420 refer to corresponding sub reference pages.

For example, referring to FIG. 4, it is assumed that the number of subpages included in each of the reference page 410 and the working page 420 is 8 (i.e., M=8), and the number of subpages included in the RAM region 430 is 6 (i.e., N=6). In addition, the relationship between an arbitrary sub working page and a subpage of the RAM 430 allocated to correspond to the sub working page is expressed as (sub working page number, RAM subpage number).

In this case, the memory allocation relationship between the working page 420 and the RAM 430 illustrated in FIG. 4 may be expressed as given below.

(W1,M2), (W4,M1), (W6,M6)

Sub working pages not allocated to the RAM 430 are allocated to sub reference pages, and the relationship therebetween is expressed as (sub working page number, sub reference page number).

In this case, the memory allocation relationship between the working page 420 and the reference page 410 illustrated in FIG. 4 may be expressed as given below.

(W2,R2), (W3,R3), (W5,R5), (W7,R7), (W8,R8)

Accordingly, the total working page 420 recognized by the CCP module 450 includes subpages given below.

(M2, R2, R3, M1, R5, M6, R7, R8)

Since the above subpage mapping relationship among the reference page 410, the working page 420 and the RAM 430 is virtualized by the calibration memory management module 400, the CCP module 450 recognizes only that the size of the working page 420 is equal to the size of the reference page 410 and that 1:1 correspondence is satisfied therebetween. Accordingly, a memory region recognized by the CCP module 450 is as indicated by a bold dashed line 460. In addition, the CCP module 450 cannot recognize that the reference page 410 and the working page 420 include a plurality of subpages, and thus does not need to consider the subpages.

Figure 5:
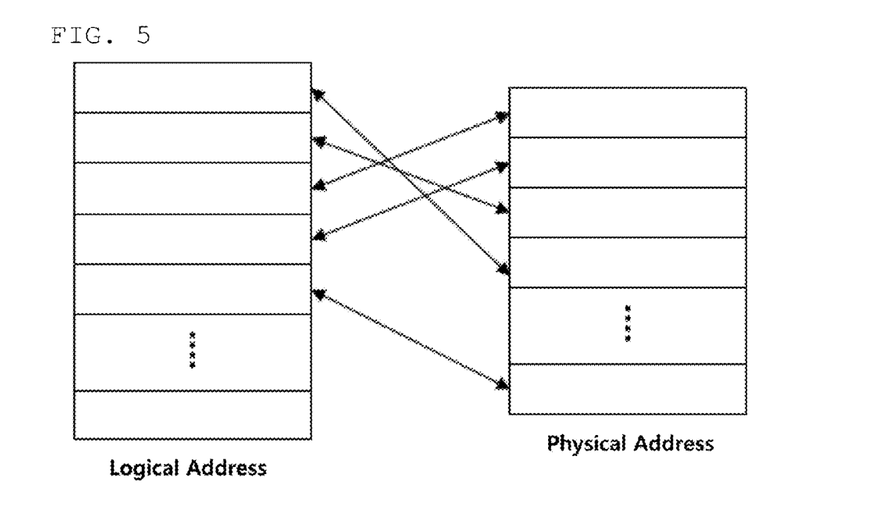
FIG. 5 is a diagram for describing an address translation method for calibration of an ECU according to an embodiment of the present invention.

FIG. 5 is a diagram for describing an address translation method for calibration of an ECU according to an embodiment of the present invention.

A vehicle control program is executed on the ECU without separately driving a loader, and an address value for variables is allocated as an absolute address in a linking process of a ROM generation procedure. Calibration data of the vehicle control program is allocated to a reference page region in the linking process. Accordingly, the vehicle control program uses an address value within the reference page to retrieve or load/store the calibration data.

That is, to retrieve or load/store the calibration data using vehicle control program code, merely changing a variable value of the working page allocated to the reference page is not enough, and an address of data referred by the code should be translated into an address within the working page instead of an address within the reference page.

A microprocessor uses an address translation function to support multiprogramming, memory sharing and protection between processes, delayed loading, etc. In this case, an address generated by the microprocessor is called a logical address, and an address used by an address register of memory is called a physical address.

When the microprocessor refers to a memory region using a load or store command, the calibration memory management module 400 according to an embodiment of the present invention translates a logical address of the microprocessor into a physical address of actual memory as illustrated in FIG. 5.

Accordingly, a logical address referred for calibration data is an address of the reference page. A logical address value of a sub reference page region is translated into an address value of a sub working page region through an address translation function of the calibration memory management module 400. As such, the address mapping relationship between the reference page and the working page may be implemented.

In addition, when the working page should be changed upon a request of the external calibration device 320, the calibration memory management module 400 may translate a corresponding logical address into a physical address of a RAM region to change the value of calibration data corresponding to the logical address such that the changed value is reflected in the vehicle control program.

Figure 6:
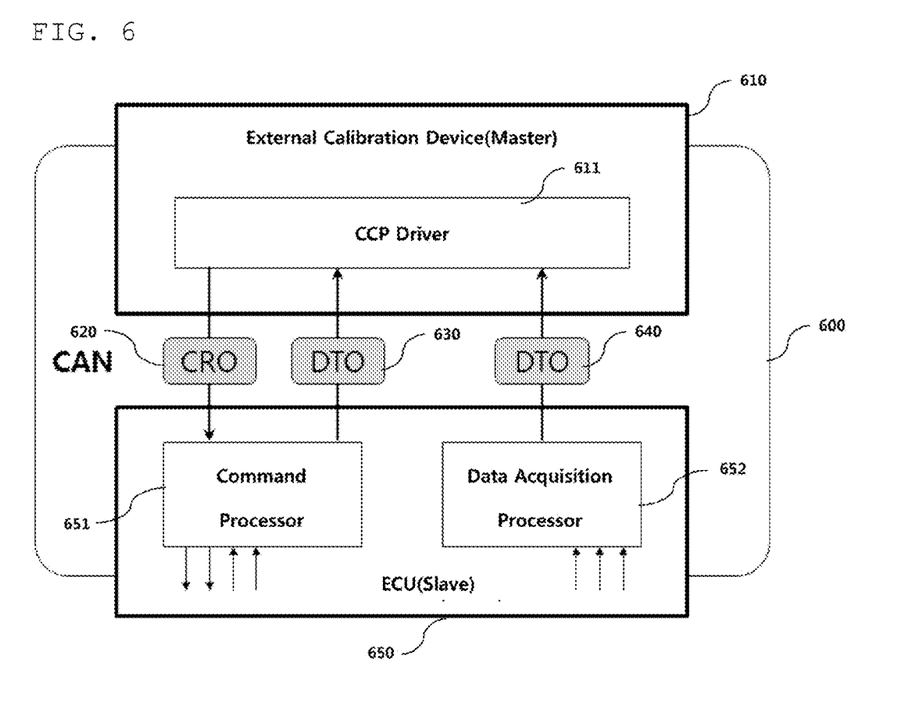
FIG. 6 is a diagram for describing operation of a CAN calibration protocol (CCP) applied to the present invention.

FIG. 6 is a diagram for describing operation of a CAN calibration protocol (CCP) applied to the present invention.

The CCP is a standard communication protocol for acquiring data from an ECU using a master module such as CANape or INCA and CAN communication or for reading or writing a specific control factor and program code for the ECU from or in EEPROM or FLASH memory. An external calibration device 610 (CCP master) and an ECU 650 (CCP slave) for calibration of the ECU 650 operate in master-slave relationship.

A CCP driver 611 of the external calibration device 610, i.e., the master, transmits a command and related factors to a command processor 651 of the ECU 650, i.e., the slave, using a command receive object (CRO) message 620, and the command processor 651 of the ECU 650, i.e., the slave, executes the command and then generates and transmits a result corresponding to the command to the CCP driver 611 of the external calibration device 610, i.e., the master, using a data transmission object (DTO) message 630. Here, the DTO message 630 is a message used when the slave 650 transmits a command return message, an event message or a data acquisition message to the master 610.

If the slave 650 should periodically or rapidly transmit data to the master 610 according to a control command received from the master 610, a data acquisition processor 652 of the slave 650 may transmit acquired data to the master 610 using a DTO message 640.

The CCP includes 11 required commands and 17 optional commands for data acquisition and calibration of the ECU 650. Commands used to change a calibration data value are DNLOAD and DNLOAD_6, and carry an address value to be used as a SET MTA (Memory Transfer Address) command. Here, a SET MTA message transmitted from the master 610 to the slave 650 includes an MTA number for identifying a transfer address location (pointer). Specifically, switching between a reference page and a working page is performed using a SELECT CAL PAGE command.

Considering the CCP module 311 as a virtual processor driven in the ECU 310, the DNLOAD command may be considered as a store or write command of calibration data using a logical address. Accordingly, if the address translation function of the calibration memory management module 312 is utilized in such a way that a logical address of a sub reference page used by the DNLOAD command is translated into a physical address of a sub working page allocated to the sub reference page, the multipage calibration algorithm according to an embodiment of the present invention may be implemented.

Figure 7:
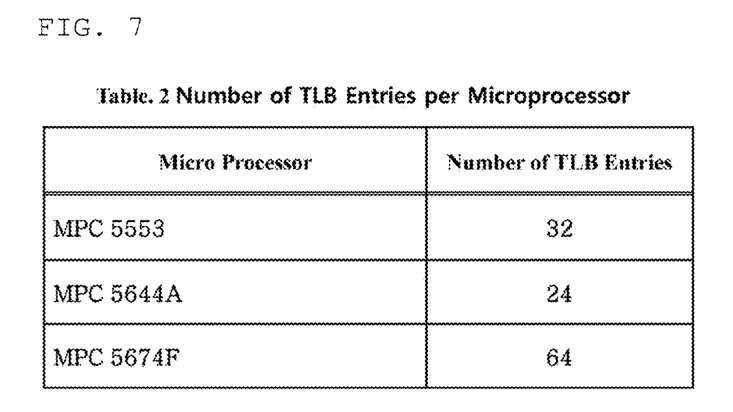
FIG. 7 is a table showing the number of translation lookaside buffer (TLB) entries per microprocessor applicable to the present invention.

FIG. 7 is a table showing the number of translation lookaside buffer (TLB) entries per microprocessor applicable to the present invention.

A data structure having correspondence information between logical addresses and physical addresses is required to translate a logical address into a physical address. Such a data structure is called a page table.

However, when a logical address region of a 32-bit microprocessor is divided into 4-KB pages, entries of the page table exceed a million. As such, an ECU having large restriction in RAM capacity preferably uses only a TLB or a TLB-miss exception.

The TLB is a sort of cache memory for storing the most recently used address translation information. When address translation is performed using information of the page table, the information of the page table may be stored in the TLB.

The information stored in the TLB is preferentially used for subsequent address translation. If address translation for all regions used by the ECU is performed using the TLB, there is no need to separately generate the page table.

FIG. 7 shows the number of TLB entries per microprocessor installed in an ECU of an eco car.

TLB entries other than entries already allocated for flash memory, S-RAM, Memory Mapped-IO, etc. may be used for address translation to execute the multipage calibration algorithm according to an embodiment of the present invention. In this case, since address translation is performed using logical address values, the number of TLB entries necessary for paging is M and 1 more TLB entry may be used for data copy between a sub reference page and a sub working page.

That is, if the subpages have equal size, one TLB entry is necessary for the correspondence between a sub reference page and a sub working page.

Accordingly, the size of a region capable of address translation using M TLB entries (hereinafter referred to as an address translation region size) may be calculated as the product of M and the subpage size. The calculated address translation region size corresponds to a total size of the reference page.

Figure 8:
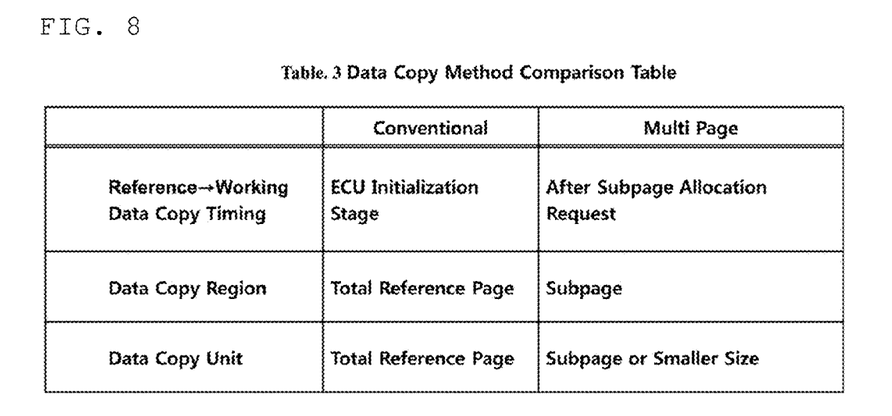
FIG. 8 is a table for comparing a calibration data copy method according to the present invention with that according to the related art.

FIG. 8 is a table for comparing a calibration data copy method according to the present invention with that according to the related art.

In the multipage calibration algorithm, which sub working page is allocated to a RAM region is not known until the RAM region is allocated for a specific sub working page. That is, unlike a conventional normal algorithm, data of a reference page may not be copied to a RAM region (working page) in an initialization stage of an ECU.

Accordingly, data copy may be performed after a request to change a corresponding subpage, and a data copy exclusive TLB entry for address translation of a corresponding RAM region may be used while data copy is being performed.

In general, if the size of a subpage is large, a time required for data copy is long. Data copy according to an embodiment of the present invention may be performed during an idle task of a scheduler in units of a size equal to or less than the size of the subpage. As such, a response delay of the ECU may be minimized.

Even while data copy is being performed, control of the ECU should be performed normally. Since a preset initial value or a garbage value may be present in a corresponding RAM region until data copy is completed, the garbage value should be controlled not to be used until data copy is completed.

Accordingly, a sub working page address is translated into a sub reference page address and data recorded on the reference page is used before data copy is completed, and data recorded on a corresponding sub working page of a corresponding RAM region may be used after data copy to the RAM region is completed.

Allocation of a RAM region corresponding to a sub reference page is triggered by a DNLOAD command of a CCP. In this case, the DNLOAD command should be executed by the ECU 650 after data copy to the corresponding RAM region is completed. In this case, since data copy is performed during the idle task of the ECU 650, data transmitted due to the DNLOAD command should be retained until data copy is completed and buffer memory is required therefor.

If a new DNLOAD command is received while the buffer memory and TLB resources are already being used according to a previous DNLOAD command, the command processor 651 of the ECU 650 may transmit a command processor busy message indicating a busy state in which resource allocation is not possible, to the external calibration device 610.

Table. 3 of FIG. 8 shows the major differences between the conventional algorithm and the multipage calibration algorithm according to the present invention.

Referring to Table. 3, with regard to a data copy timing from a reference page to a working page, the conventional algorithm performs data copy in an initialization stage of an ECU, but the present invention performs data copy after a subpage allocation request.

Furthermore, with regard to a data copy region from the reference page to the working page, the conventional algorithm copies a total reference page region to the working page, but the present invention performs data copy in units of a subpage.

In addition, with regard to a data copy unit from the reference page to the working page, the conventional algorithm copies a total reference page region at once, but the present invention performs data copy during an idle task of an ECU in units of a size equal to or less than a subpage size.

Figure 9:
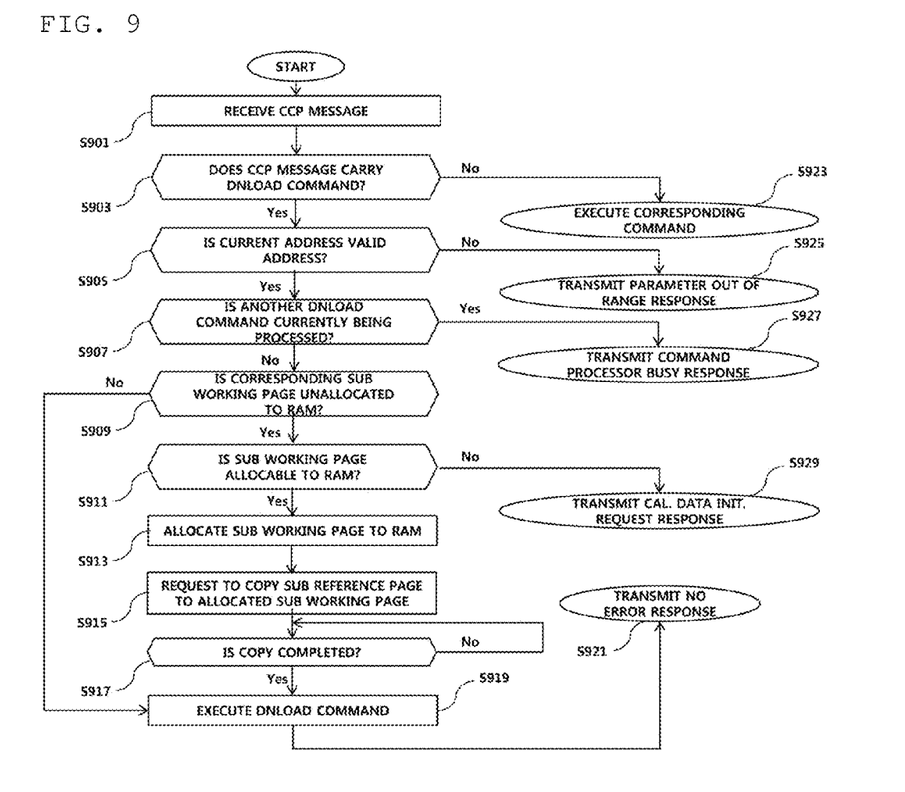
FIG. 9 is a flowchart of a RAM region allocation method for calibration of an ECU according to an embodiment of the present invention.

FIG. 9 is a flowchart of a RAM region allocation method for calibration of the ECU 650 according to an embodiment of the present invention.

Referring to FIG. 9, upon receiving a CCP message from the external calibration device 610, the ECU 650 determines whether the CCP message carries a DNLOAD command (S901 and S903).

Upon determining that the CCP message carries a DNLOAD command, the ECU 650 determines whether a current MTA0 (Memory Transfer Address Number 0) address is a valid address capable of storing a data block included in the DNLOAD command, based on a start address of MTA0 set according to a previously received SET MTA command (S905). For example, if the size of the data block included in the DNLOAD command exceeds 5 bytes, the ECU 650 may generate and transmit a parameter out of range response message to the external calibration device 610 (S925). On the other hand, if it is determined that the CCP message does not carry DNLOAD command, the ECU 650 may execute a corresponding command (S923).

Upon determining that the current MTA0 address is a valid address in S905, the ECU 650 may buffer the data block included in the DNLOAD command in a corresponding memory region, and check a virtual sub reference page number based on download-requested MTA0.

Subsequently, the ECU 650 determines whether another DNLOAD command is currently being processed (S907).

Upon determining that another DNLOAD command is currently being processed, the ECU 650 generates and transmits a command processor busy response message to the external calibration device 610 (S927).

Upon determining that no other DNLOAD command is currently being processed in S907, the ECU 650 determines whether a sub working page corresponding to the checked sub reference page is unallocated to RAM (S909).

Upon determining that a sub working page is unallocated to RAM, the ECU 650 determines whether the sub working page corresponding to the checked sub reference page is allocable to RAM (S911). Here, upon determining that the sub working page is not allocable to RAM, the ECU 650 may transmit a calibration data initialization request response message to the external calibration device 610 (S929).

Upon determining that the sub working page is allocable to RAM in S911, the ECU 650 allocates the sub working page corresponding to the checked sub reference page to RAM (S913).

Subsequently, the ECU 650 copies data stored in the checked sub reference page to the allocated sub working page (S915).

In this case, the ECU 650 performs data copy during an idle task, and executes the DNLOAD command by reading the buffered data block if data copy is completed (S917 and S919).

After that, if the DNLOAD command has been successfully executed, the ECU 650 transmits a no error message indicating successful execution of the DNLOAD command to the external calibration device 610 (S921).

Upon determining that a sub working page corresponding to the checked sub reference page is already allocated in S909, the ECU 650 may execute the DNLOAD command in S919 by reading the buffered data block.

As described above, when the ECU 650 is initialized, a sub working page corresponding to each sub reference page is set as the sub reference page itself. If the context of the sub working page should be changed according to the DNLOAD command of the external calibration device 610, the ECU 650 may determine whether a RAM region is allocated for the sub working page, and may allocate a RAM region corresponding to the sub working page according to the determination result.

As is apparent from the above description, the method and apparatus according to the present invention have the following effects.

First, the present invention has an advantage of providing a memory control method and apparatus capable of expanding calibration memory of an ECU.

Second, the present invention has an advantage of providing a calibration memory control method capable of expanding actually available calibration memory of an ECU by dynamically allocating a working page based on an external calibration request.

Third, the present invention has an advantage of reducing the cost of an ECU not using external memory but using internal memory of a microprocessor for calibration of the ECU.

It will be appreciated by persons skilled in the art that the effects that could be achieved through the present invention are not limited to what has been particularly described hereinabove and other advantages of the present invention will be more clearly understood from the above detailed description.

Those skilled in the art will appreciate that the present invention may be carried out in other specific ways than those set forth herein without departing from the spirit and essential characteristics of the present invention.

The above exemplary embodiments are therefore to be construed in all aspects as illustrative and not restrictive. The scope of the invention should be determined by the appended claims and their legal equivalents, not by the above description, and all changes coming within the meaning and equivalency range of the appended claims are intended to be embraced therein.

What is claimed is:

1. A calibration memory control method of an electronic control unit (ECU) connected to an external calibration device, the method comprising steps of:
   receiving a download command from the external calibration device;
   checking a sub reference page corresponding to the download command;
   determining whether a sub working page corresponding to the checked sub reference page is allocated;
   allocating the sub working page corresponding to the checked sub reference page to a RAM region upon determining that the sub working page is not allocated; and
   copying data stored in the checked sub reference page to the allocated sub working page,
   wherein, when the ECU is initialized, a reference page is divided into M sub reference pages each configured to have 1:1 correspondence to a virtual sub working page,
   wherein the M is an integer greater than or equal to 2, and
   wherein the RAM region has a size less than a total size of the reference page.

2. The calibration memory control method according to claim 1, further comprising storing a data block comprised in the download command in a part of the allocated sub working page if the data is completely copied.

3. The calibration memory control method according to claim 1, wherein the data is copied during an idle task of a scheduler mounted on the ECU.

4. The calibration memory control method according to claim 3, wherein the data is copied during the idle task in units of a size equal to or less than a size of the sub working page.

5. The calibration memory control method according to claim 1, wherein sub working pages not allocated to the RAM region refer to sub reference pages configured to have 1:1 correspondence to the sub working pages.

6. The calibration memory control method according to claim 1, further comprising immediately executing a command other than the download command if the command is received from the external calibration device.

7. The calibration memory control method according to claim 1, further comprising transmitting a parameter out of range response message to the external calibration device if a data block comprised in the download command exceeds a reference size.

8. The calibration memory control method according to claim 1, further comprising storing a data block comprised in the download command in the sub working page upon determining that the sub working page corresponding to the checked sub reference page is already allocated.

9. The calibration memory control method according to claim 1, further comprising steps of:
determining whether another download command is currently being processed; and
transmitting a command processor busy response message to the external calibration device upon determining that the other download command is currently being processed.

10. The calibration memory control method according to claim 1, further comprising storing a data block comprised in the download command in pre-designated buffer memory until the data is completely copied.

11. The calibration memory control method according to claim 1, wherein the download command is received through controller area network (CAN) communication.

12. An electronic control unit (ECU) connected to an external calibration device, the ECU comprising:
means for receiving a download command from the external calibration device;
means for checking a sub reference page corresponding to the download command;
means for determining whether a sub working page corresponding to the checked sub reference page is allocated;
means for allocating the sub working page corresponding to the checked sub reference page to a RAM region upon determining that the sub working page is not allocated; and
means for copying data stored in the checked sub reference page to the allocated sub working page,
wherein, when the ECU is initialized, a reference page is divided into M sub reference pages each configured to have 1:1 correspondence to a virtual sub working page,
wherein the M is an integer greater than or equal to 2, and
wherein the RAM region has a size less than a total size of the reference page.

13. The ECU according to claim 12, further comprising means for storing a data block comprised in the download command in a part of the allocated sub working page if the data is completely copied.

14. The ECU according to claim 12, wherein the data is copied during an idle task of a scheduler mounted on the ECU.

15. The ECU according to claim 14, wherein the data is copied during the idle task in units of a size equal to or less than a size of the sub working page.

16. The ECU according to claim 12, wherein sub working pages not allocated to the RAM region refer to sub reference pages configured to have 1:1 correspondence to the sub working pages.

17. The ECU according to claim 12, wherein the sub working page allocated to the RAM region is changeable by the download command.

18. The ECU according to claim 12, wherein a command other than the download command is immediately executed if the command is received from the external calibration device.

19. The ECU according to claim 12, wherein a parameter out of range response message is transmitted to the external calibration device if a data block comprised in the download command exceeds a reference size.

20. The ECU according to claim 12, wherein a data block comprised in the download command is stored in the sub working page upon determining that the sub working page corresponding to the checked sub reference page is already allocated.

21. The ECU according to claim 12, further comprising means for determining whether another download command is currently being processed, wherein the ECU transmits a command processor busy response message to the external calibration device upon determining that the other download command is currently being processed.

22. The ECU according to claim 12, wherein a data block comprised in the download command is stored in pre-designated buffer memory until the data is completely copied.

23. The ECU according to claim 12, wherein the download command is received through controller area network (CAN) communication.

24. An electronic control unit (ECU) connected to an external calibration device, the ECU comprising:
a controller area network (CAN) calibration protocol (CCP) module transmitting and receiving a CCP message to and from the external calibration device; and
a calibration memory management module dynamically allocating memory to be used for calibration in response to the received CCP message,
wherein the calibration memory management module divides a reference page and a working page into M sub reference pages and M sub working pages, respectively, and divides a RAM region for calibration data into N subpages, in which N is less than M,
wherein the calibration memory management module manages sub working pages of the working page not to be allocated to a RAM region among the sub working pages corresponding to sub reference pages of the reference page, and
wherein, when the ECU is initialized, the calibration memory management module divides a reference page into M sub reference pages each configured to have 1:1 correspondence to a virtual sub working page,
wherein the M and N are an integer greater than or equal to 2, and
wherein the RAM region has a size less than a total size of the reference page.

* * * * *